United States Patent
Sakamoto

(10) Patent No.: US 8,619,461 B2
(45) Date of Patent: Dec. 31, 2013

(54) NONVOLATILE SEMICONDUCTOR MEMORY DEVICE

(75) Inventor: Kei Sakamoto, Nagoya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/595,258

(22) Filed: Aug. 27, 2012

(65) Prior Publication Data
US 2013/0077380 A1  Mar. 28, 2013

(30) Foreign Application Priority Data
Sep. 22, 2011  (JP) ................... 2011-208194

(51) Int. Cl.
*G11C 11/00* (2006.01)

(52) U.S. Cl.
USPC ......................................................... 365/148

(58) Field of Classification Search
USPC ......................................................... 365/148
See application file for complete search history.

(56) References Cited

U.S. PATENT DOCUMENTS

| | | | |
|---|---|---|---|
| 6,567,295 B2 * | 5/2003 | Taussig et al. | 365/105 |
| 7,184,301 B2 * | 2/2007 | Sugibayashi et al. | 365/158 |
| 8,023,313 B2 | 9/2011 | Toda | |
| 8,154,906 B2 * | 4/2012 | Liu | 365/148 |
| 8,482,972 B2 * | 7/2013 | Chung | 365/175 |
| 2008/0239932 A1 | 10/2008 | Kamata et al. | |
| 2012/0044758 A1 * | 2/2012 | Chung | 365/173 |

FOREIGN PATENT DOCUMENTS

| | | |
|---|---|---|
| JP | 2005-331586 | 12/2005 |
| JP | 2008-276904 | 11/2008 |
| JP | 2009-266312 | 11/2009 |
| JP | 2010-55719 | 3/2010 |
| JP | 2010-177387 | 8/2010 |

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

A nonvolatile semiconductor memory device includes a memory cell array including cells provided at each of intersections of first and second lines and each having a variable resistance element and a first diode connected in series; a first line control circuit for supplying voltages to the first lines; and a second line control circuit for supplying voltages to the second lines, the cells each having one of the second lines connected to an anode side of the first diode and one of the first lines connected to a cathode side of the first diode, and the memory cell array including a second diode inserted in each of the second lines between the second line control circuit and the cells and each having a side of the second line control circuit as an anode and a side of the cells as a cathode.

20 Claims, 10 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-208194, filed on Sep. 22, 2011, the entire contents of which are incorporated herein by reference.

FIELD

The embodiments relate to a nonvolatile semiconductor memory device.

BACKGROUND

In recent years, attention is being given to a nonvolatile semiconductor memory device that employs ReRAM (Resistive RAM) in a cross-point type memory cell, the ReRAM having a structure where an oxide film is sandwiched above and below by an electrode. This memory cell sometimes combines the ReRAM with a rectifying element of a diode or the like.

Operations of this memory cell include a setting operation in which a certain setting voltage being applied to the electrodes above and below the oxide film causes a resistance value of the oxide film to be lowered, and a resetting operation in which a certain resetting voltage being applied causes the resistance value of the oxide film to be raised. In addition, it is also required that, in an initial process, forming is executed, forming being to form a current path in the oxide film in order to make these setting operation and resetting operation possible.

When these operations or forming are executed in a certain selected memory cell, a bias state is created in a memory cell array to prevent these operations or forming from occurring in other unselected memory cells, the bias state being such that a bias in a reverse direction of the diode is applied to the unselected memory cells. However, in this case, a reverse direction current gets generated in the unselected memory cells, and when circuit scale becomes large, size of the reverse direction current becomes unable to be ignored. The problem becomes particularly great in forming, because a larger reverse direction bias is applied in forming than in the setting operation and resetting operation.

DETAILED DESCRIPTION

A nonvolatile semiconductor memory device according to an embodiment comprises: a memory cell array including a plurality of first lines and second lines intersecting each other and a plurality of memory cells provided at each of intersections of the plurality of first lines and second lines and each having a variable resistance element and a first diode connected in series; a first line control circuit for supplying a selected first line voltage to a selected first line among the first lines that is connected to a selected access target memory cell among the memory cells, and supplying an unselected first line voltage to an unselected first line among the first lines other than the selected first line; and a second line control circuit for supplying a selected second line voltage to a selected second line among the second lines that is connected to the selected access target memory cell, and supplying an unselected second line voltage to an unselected second line among the second lines other than the selected second line, the memory cells each having one of the second lines connected to an anode side of the first diode and one of the first lines connected to a cathode side of the first diode, and the memory cell array including a second diode which is inserted in each of the second lines between the second line control circuit and the memory cells and has a side of the second line control circuit as an anode and a side of the memory cells as a cathode.

A nonvolatile semiconductor memory device according to embodiments is described below with reference to the drawings.

First Embodiment

<Overall Configuration>

Figure 1:
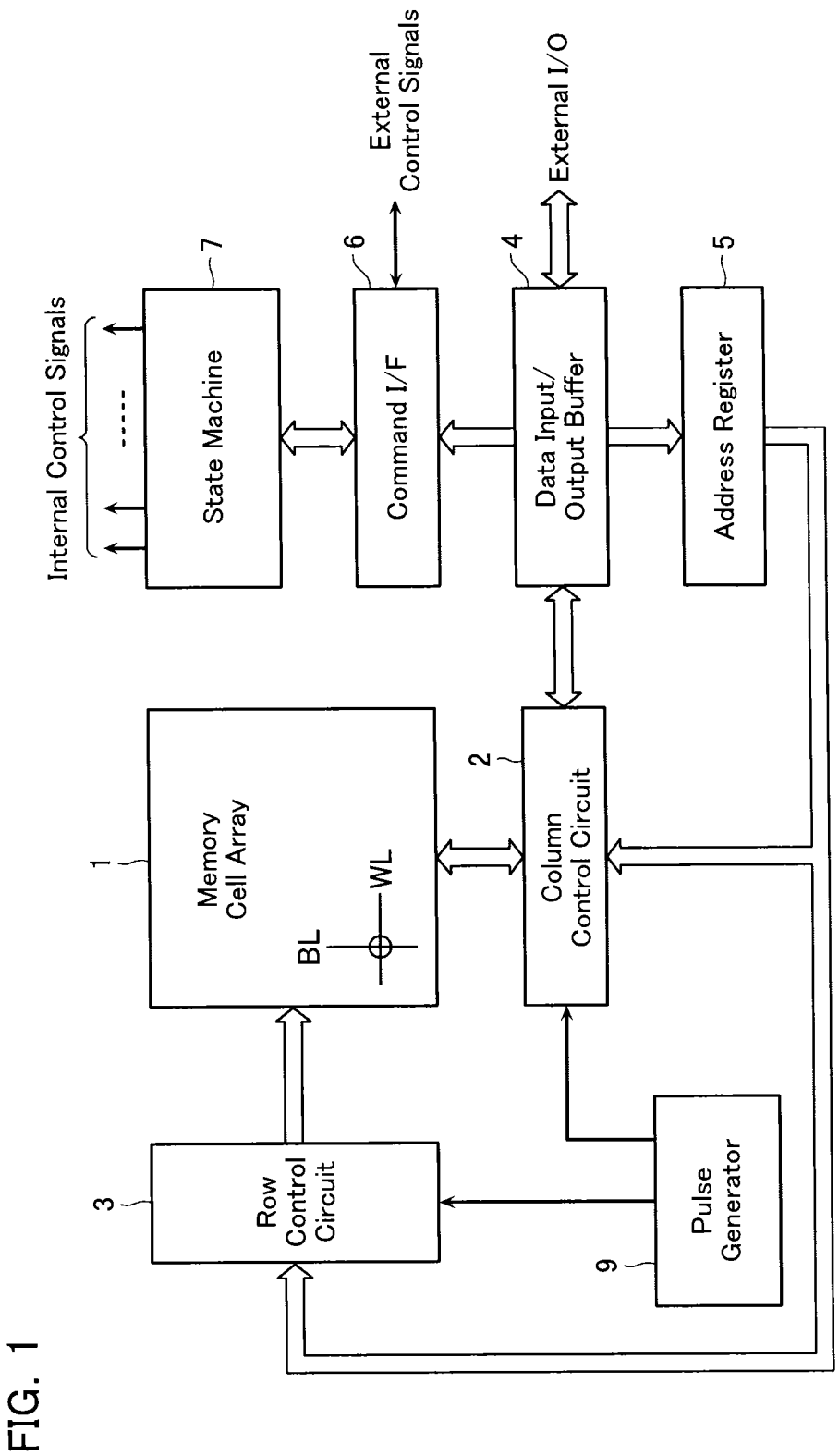
FIG. 1 is a block diagram of a nonvolatile semiconductor memory device according to a first embodiment.

FIG. 1 is a block diagram of a nonvolatile semiconductor memory device according to a first embodiment.

This nonvolatile semiconductor memory device comprises a memory cell array 1 having memory cells disposed in a matrix therein, each of the memory cells using a ReRAM (variable resistance element) to be described later. Provided at a position adjacent to the memory cell array 1 in a bit line BL direction is a column control circuit 2 (second line control circuit) for controlling bit lines BL of the memory cell array 1 and performing data write to the memory cells and data read from the memory cells. In addition, provided at a position adjacent to the memory cell array 1 in a word line WL direction is a row control circuit 3 (first line control circuit) for selecting word lines WL of the memory cell array 1 and supplying voltages required in data write to the memory cells and data read from the memory cells. Note that the column control circuit 2 and row control circuit 3 are included in a data write unit.

A data input/output buffer 4 is connected via an I/O line to an external host not shown and receives write data, outputs read data, and receives address data, command data, and so on. The data input/output buffer 4 sends received write data to the column control circuit 2, and receives data read from the column control circuit 2 and outputs this received read data to external. An address supplied to the data input/output buffer 4 from external is sent via an address register 5 to the column control circuit 2 and the row control circuit 3. In addition, a command supplied to the data input/output buffer 4 from the host is sent to a command interface 6. The command interface 6 receives an external control signal from the host to judge whether data inputted to the data input/output buffer 4 is write data or a command or an address, and, if a command, transfers the data to a state machine 7 as a received command signal. The state machine 7 performs management of this nonvolatile semiconductor memory device in entirety, and receives commands from the host to perform read, write, data input/output management, and so on. Moreover, it is also possible for the external host to receive status information managed by the state machine 7 to judge operation results. This statue information is used also in control of write.

In addition, the state machine 7 controls a pulse generator 9. This control enables the pulse generator 9 to output a pulse of any voltage and any timing. Specifically, the state machine 7 receives input of an address provided from external, via the address register 5, determines which memory cell is to be accessed, and uses parameters corresponding to that memory cell to control a height and width of a pulse from the pulse generator 9. The pulse formed herein can be transferred to any line selected by the column control circuit 2 and the row control circuit 3.

Note that peripheral circuits other than the memory cell array 1 can be formed in a silicon substrate directly below the memory cell array 1, thereby enabling a chip area of this semiconductor memory device to be set substantially equal to an area of the memory cell array 1.

[Memory Cell and Memory Cell Array]

Figure 2:
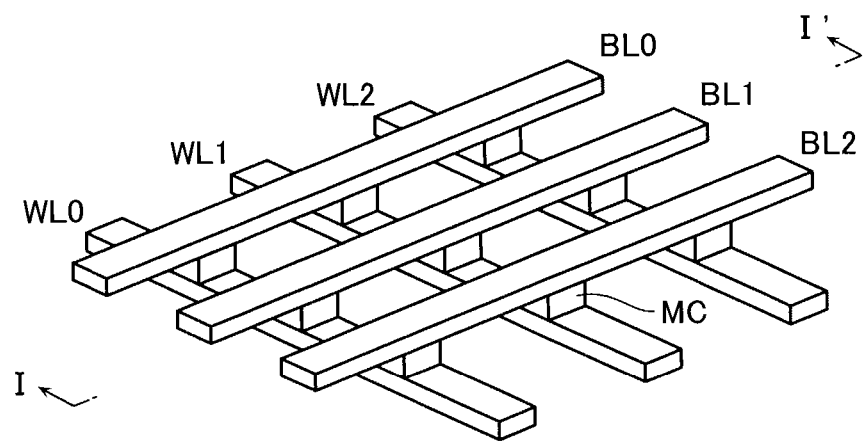
FIG. 2 is a perspective view of part of a memory cell array in the nonvolatile semiconductor memory device according to same embodiment.
Figure 3:
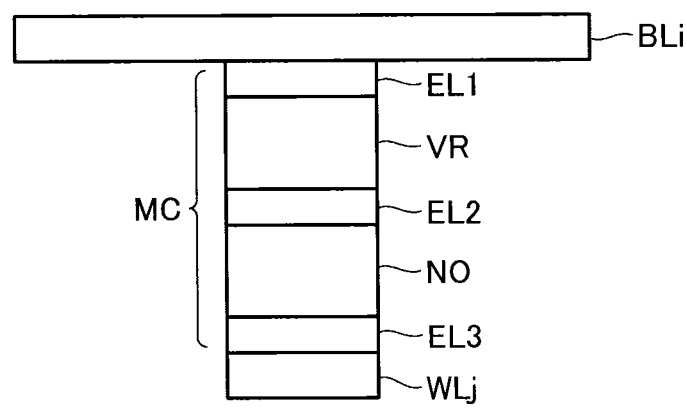
FIG. 3 is a cross-sectional view taken along the line I-I' and viewed in the direction of the arrows in FIG. 2, showing a single memory cell portion.

FIG. 2 is a perspective view of part of the memory cell array 1, and FIG. 3 is a cross-sectional view taken along the line I-I' and viewed in the direction of the arrows in FIG. 2, showing a single memory cell portion.

A plurality of word lines WL0-WL2 (first lines) are arranged in parallel, a plurality of bit lines BL0-BL2 (second lines) are arranged in parallel intersecting these word lines WL0-WL2, and memory cells MC are disposed at each of intersections of these word lines WL0-WL2 and bit lines BL0-BL2 so as to be sandwiched by both lines. The word lines WL and bit lines BL preferably employ a material that is heat-resistant and has a low resistance value, for example, tungsten (W), tungsten silicide (WSi), nickel silicide (NiSi), cobalt silicide (CoSi), or the like.

As shown in FIG. 3, the memory cell MC is configured from a series-connected circuit of a variable resistance element VR and a non-ohmic element NO.

The variable resistance element VR is capable of having its resistance value changed through current, heat, chemical energy and the like, when applied with a voltage. Disposed above and below the variable resistance element VR are electrodes EL1 and EL2 functioning as a barrier metal and an adhesive layer. Employable as an electrode material are Pt, Au, Ag, TiAlN, SrRuO, Ru, RuN, Ir, Co, Ti, TiN, TaN, LaNiO, Al, PtIrO$_x$, PtRhO$_x$, Rh/TaAlN, and the like. Moreover, insertion of a metal film to make orientation uniform is also possible. Furthermore, a separate buffer layer, barrier metal layer, adhesive layer, and so on, may also be inserted.

The variable resistance element VR may be a composite compound including cations of a transitional element that changes its resistance value by movement of the cations (ReRAM).

<Setting Operation, Resetting Operation, and Forming>

Next, operation of the memory cell MC is simply described. A memory cell MC that performs unipolar operation using a diode as the non-ohmic element NO is described herein. Note that operation described herein is one example, and it should be noted that various operations are possible according to a substance.

In the case of this memory cell MC that performs unipolar operation, a resistance state of the variable resistance element VR can be switched by controlling a voltage value and voltage application time of a voltage applied to the memory cell MC, without switching a polarity of said voltage. Hereafter, an operation in which the variable resistance element VR in a high-resistance state is changed to a low-resistance state is called a "setting operation", and an operation in which the variable resistance element VR in a low-resistance state is changed to a high-resistance state is called a "resetting operation".

In the setting operation, the variable resistance element VR is applied with, for example, a voltage of about 1.5 V (hereafter, called a "setting voltage") and a current of about 10 nA for a time of about 10-100 ns. Applying a high voltage to the variable resistance element VR in this way causes movement of cations (positively charged ions) within the variable resistance element VR to occur, whereby a substance in an insulating state undergoes a phase change to a state of series coupling of a conductive body substance (quasi-) stable in terms of electro-chemical potential. As a result, the resistance state of the variable resistance element VR undergoes transition from a high-resistance state to a low-resistance state.

On the other hand, in the resetting operation, the variable resistance element VR is applied with, for example, a voltage of about 0.6 V (hereafter, called a "resetting voltage") and a current of about 1-10 μA for a time of about 500 ns-2 μs. When the variable resistance element VR is applied with a low voltage for a long time in this way, Joule heat is generated within the variable resistance element VR, whereby atoms undergo heat diffusion to change to a state of thermal equilibrium. As a result, the resistance state of the variable resistance element VR undergoes transition from a low-resistance state to a high-resistance state.

Incidentally, the variable resistance element VR immediately after manufacturing is in a steady high-resistance state with an unchanging resistance value. Therefore, in order to perform the above-described setting operation or resetting operation in the variable resistance element VR, it is required that the variable resistance element VR undergoes a treatment called forming. This forming refers to applying a certain voltage (hereafter, called a "forming voltage") to between the electrodes EL1 and EL2 above and below the variable resistance element VR to thereby form a low-resistance region called a filament path in the variable resistance element VR.

Moreover, the forming voltage employed at this time is much higher than the setting voltage or resetting voltage, and has a magnitude of, for example, 5-10 V.

Next, to make it easier to understand the present embodiment, forming in a nonvolatile semiconductor memory device according to a comparative example is described.

Figure 13:
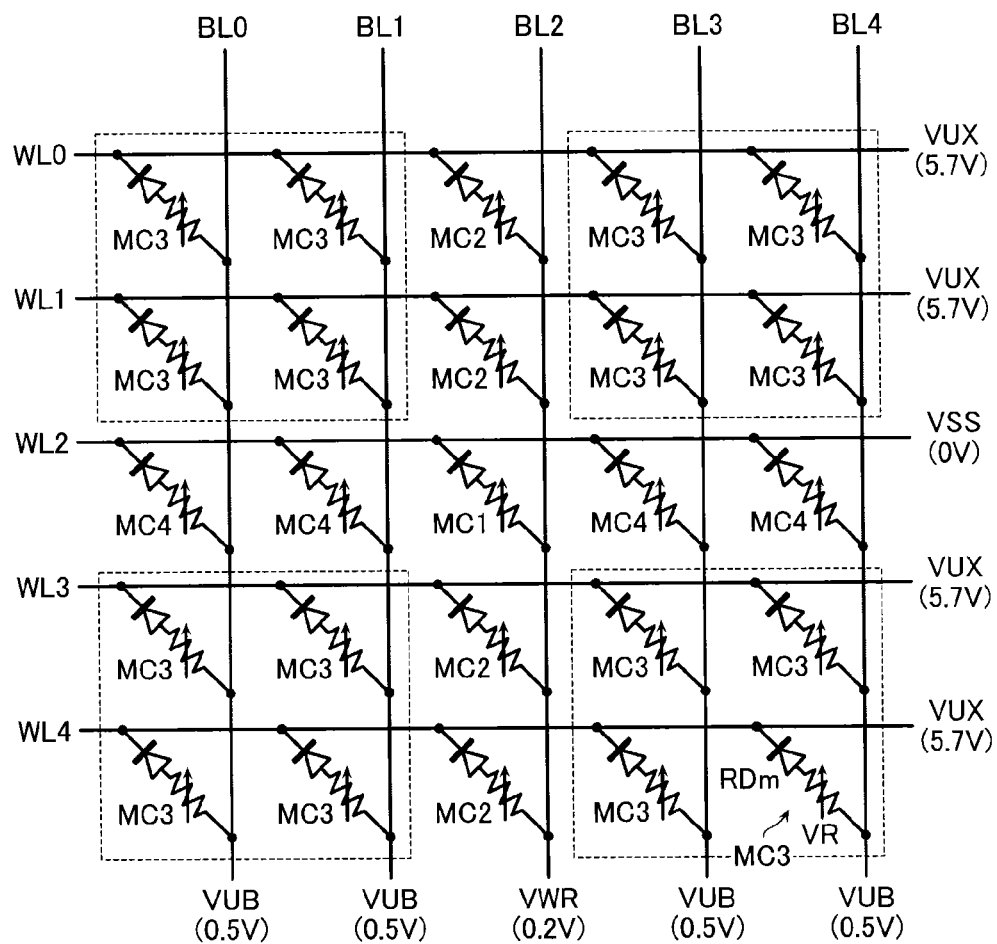
FIG. 13 is a circuit diagram of a memory cell array and a view showing a bias state of the memory cell array during forming in a nonvolatile semiconductor memory device according to a comparative example.
Figure 14:
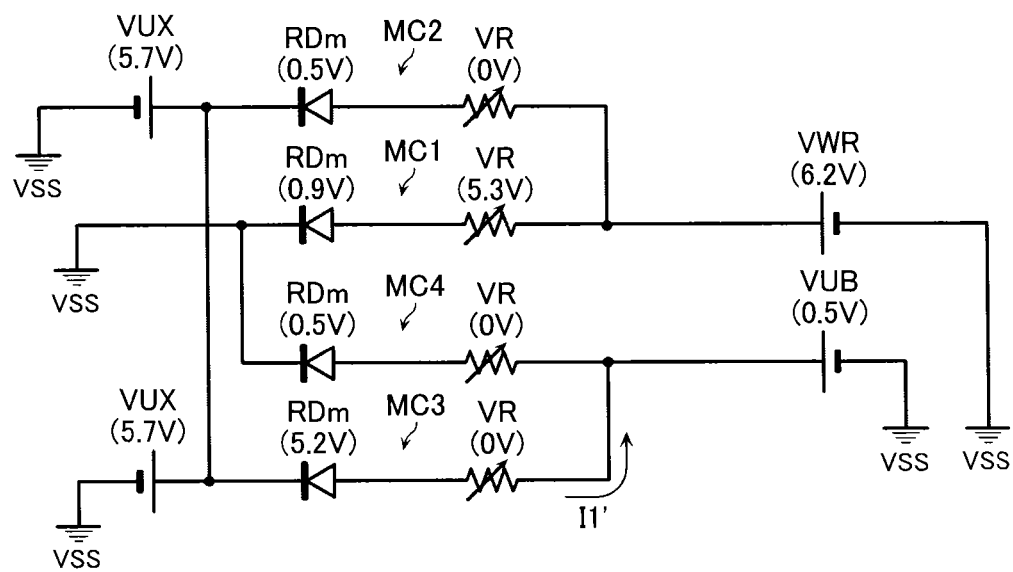
FIG. 14 is an equivalent circuit diagram making it easier to view the bias state of the memory cells shown in FIG. 13.

FIG. 13 is a view showing a bias state of a memory cell array during forming in the nonvolatile semiconductor memory device according to the comparative example, and FIG. 14 is an equivalent circuit diagram making it easier to view the bias state of memory cells MC1-MC4 shown in FIG. 13.

FIG. 13 shows word lines WL0-WL4 (first lines), bit lines BL0-BL4 (second lines), and memory cells MC provided at each of intersections of these word lines WL and bit lines BL. Moreover, each of the memory cells MC is configured from a variable resistance element VR and a diode RDm connected in series. The cathode and anode of the diode RDm are connected to the bit line BL and word line WL, respectively. Therefore, when a voltage of the bit line BL is higher than a voltage of the word line WL, a forward direction bias is applied to the memory cell MC and a forward direction current flows in the memory cell MC. Conversely, when a voltage of the word line WL is higher than a voltage of the bit line BL, a reverse direction bias is applied to the memory cell MC and a reverse direction current flows in the memory cell MC.

The memory cell array having the configuration shown above is described below taking as an example the case of forming the memory cells MC connected to the word line WL2 and the bit line BL2. Hereafter, a forming target (access target) memory cell MC is called a "selected memory cell", another memory cell MC is called an "unselected memory cell", a word line WL connected to a selected memory cell is called a "selected word line" (selected first line), another word line WL is called an "unselected word line" (unselected first line), a bit line BL connected to a selected memory cell is called a "selected bit line" (selected second line), and another bit line BL is called an "unselected bit line" (unselected second line). Therefore, in the present example, the selected word line is the word line WL2 and the selected bit line is the bit line BL2.

When forming the selected memory cell MC2 connected between the selected word line WL2 and the selected bit line BL2, the selected bit line BL is applied with a forming voltage VWR of 6.2 V and the selected word line WL is applied with a ground voltage VSS (0 V), and the unselected bit lines BL are applied with an unselected bit line voltage VUB of 0.5 V and the unselected word lines WL are applied with an unselected word line voltage VUX of 5.7 V.

Now, the diode RDm is assumed to be an element having an ordinary voltage-current characteristic, and if a voltage drop in the diode RDm in the memory cells MC1, MC2, MC3, and MC4 is assumed to be 0.9 V, 0.5V, 5.2V, and 0.5 V, respectively, then the selected memory cell MC1 connected to the selected word line WL2 and the selected bit line BL2 is applied with a forward direction bias of 6.2 V required for forming.

On the other hand, the unselected memory cells MC2 connected to the unselected word lines WL0, WL1, WL3, and WL4 and the selected bit line BL2 are applied with a forward direction bias of 0.5 V, the unselected memory cells MC3 connected to the unselected word lines WL0, WL1, WL3, and WL4 and the unselected bit lines BL0, BL1, BL3, and BL5 are applied with a reverse direction bias of 5.2 V, and the unselected memory cells MC4 connected to the selected word line WL2 and the unselected bit lines BL0, BL1, BL3, and BL4 are applied with a forward direction bias of 0.5 V. However, the bias applied to these memory cells MC2-MC4 is not large enough to enable forming.

In other words, setting the memory cell array to a bias state of the kind shown in FIG. 13 allows only the selected memory cell MC1 to be formed.

However, in the case shown in FIG. 13, the unselected memory cells MC3 surrounded by broken lines in FIG. 13 are applied with a reverse direction bias as large as 5.7 V, whereby a large reverse direction current flows in said unselected memory cells MC3. Moreover, if it is considered that the majority of the memory cells MC configuring the memory cell array are unselected memory cells MC3, the effect of this reverse direction current is large, and particularly in the case of a large scale memory cell array, is of a magnitude unable to be ignored in terms of power consumption. Although there is a difference in degree, the same can be said to apply also to during the setting operation or the resetting operation.

Accordingly, in the present embodiment, a diode is inserted in the bit lines BL to suppress the reverse direction bias applied to the memory cells MC3. Note that, in order to distinguish this diode from the diode RDm in the memory cells MC, it is decided to call the diode RDm in the memory cells MC a "memory cell diode" (first diode), and to call the diode inserted in the bit lines BL a "reverse direction current lowering diode" (second diode).

Figure 4:
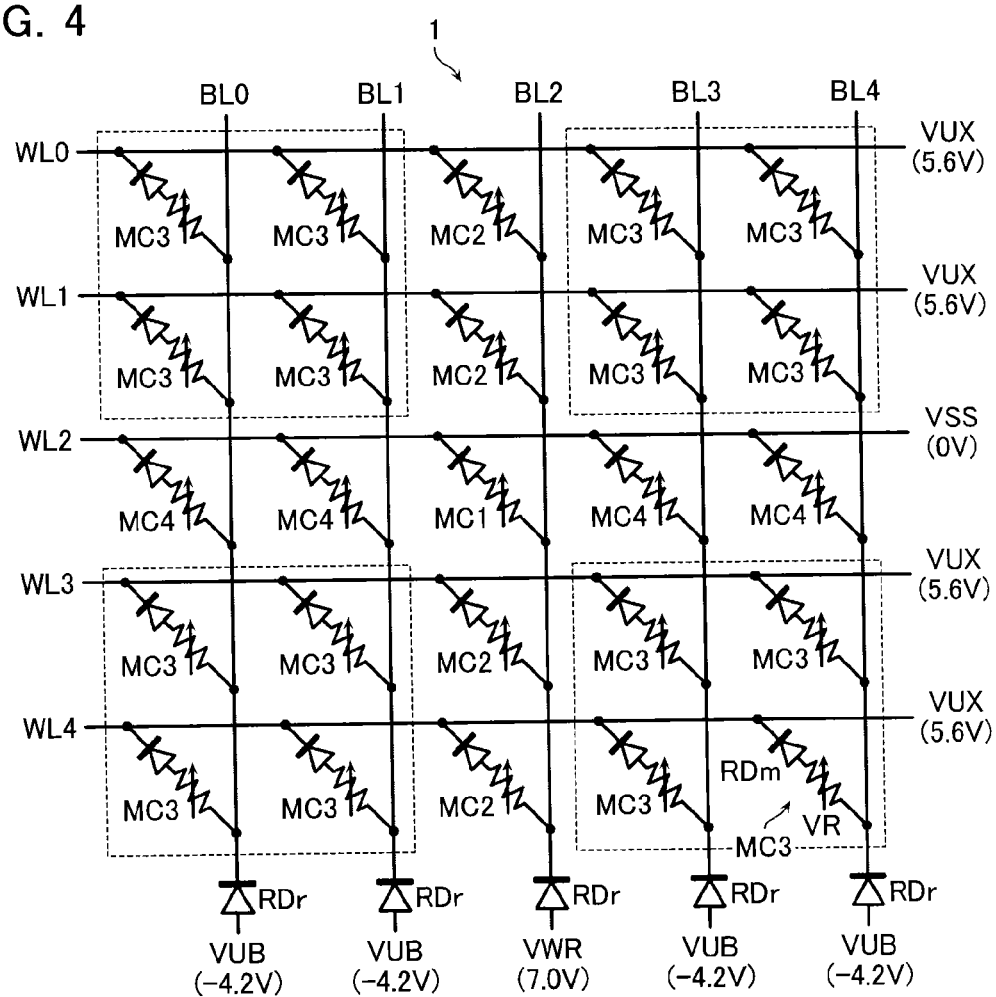
FIG. 4 is a circuit diagram of the memory cell array and a view showing a bias state of the memory cell array during forming in the nonvolatile semiconductor memory device according to same embodiment.
Figure 5:
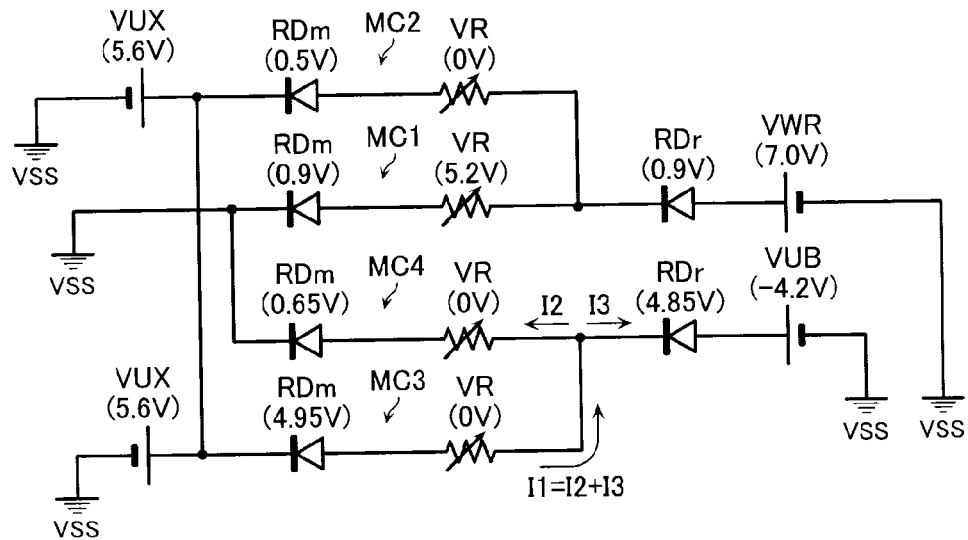
FIG. 5 is an equivalent circuit diagram making it easier to view the bias state of the memory cells shown in FIG. 4.

FIG. 4 is an equivalent circuit diagram of the memory cell array 1 showing at the same time a bias state during forming in the nonvolatile semiconductor memory device according to the present embodiment. In addition, FIG. 5 is an equivalent circuit diagram making it easier to view the bias state of the memory cells MC1-MC4 shown in FIG. 4.

The memory cell array 1 in the nonvolatile semiconductor memory device according to the present embodiment has a reverse direction current lowering diode RDr inserted in each of the plurality of bit lines BL in the memory cell array shown in FIG. 13, the reverse direction current lowering diode RDr having a side of the column control circuit 2 which is a voltage supply source as an anode and a side of the memory cells MC as a cathode.

In the case of forming in the present embodiment, the selected bit line BL is applied with, for example, a forming voltage VWR (selected second line voltage) of 7.0 V and the selected word line WL is applied with, for example, a ground voltage VSS (0 V) (selected first line voltage), and the unselected bit lines BL are applied with, for example, an unselected bit line voltage VUB (unselected second line voltage) of −4.2 V and the unselected word lines WL are applied with, for example, an unselected word line voltage VUX (unselected first line voltage) of 5.6 V.

In this case, if a voltage-current characteristic of the reverse direction current lowering diode RDr is assumed to be comparable with the voltage-current characteristic of the memory cell diode RDm, then a voltage drop in the memory cell diode RDm in the memory cells MC1, MC2, MC3, and MC4 is, for example, 0.9 V, 0.5 V, 4.95 V, and 0.65 V, respectively. Moreover, the reverse direction current lowering diode RDr inserted in the selected bit line BL and the unselected bit lines BL is, for example, 0.9 V and 4.85 V, respectively.

As a result, the selected memory cell MC1 is applied with a forward direction bias of 6.1 V required for forming.

On the other hand, the unselected memory cells MC2 are applied with a forward direction bias of 0.5V, the unselected memory cells MC3 are applied with a reverse direction bias of 4.95 V, and the unselected memory cells MC4 are applied with a forward direction bias of 0.65 V.

In other words, setting the memory cell array 1 to a bias state of the kind shown in FIG. 4 allows only the selected memory cell MC1 to be formed similarly to in the comparative example, and, at the same time, enables the reverse direction bias applied to the unselected memory cells MC3 and a reverse direction current flowing in the unselected memory cells MC3 to be lowered compared to in the comparative example. In other words, power consumption in the unselected memory cells MC3 can be reduced.

Figure 6:
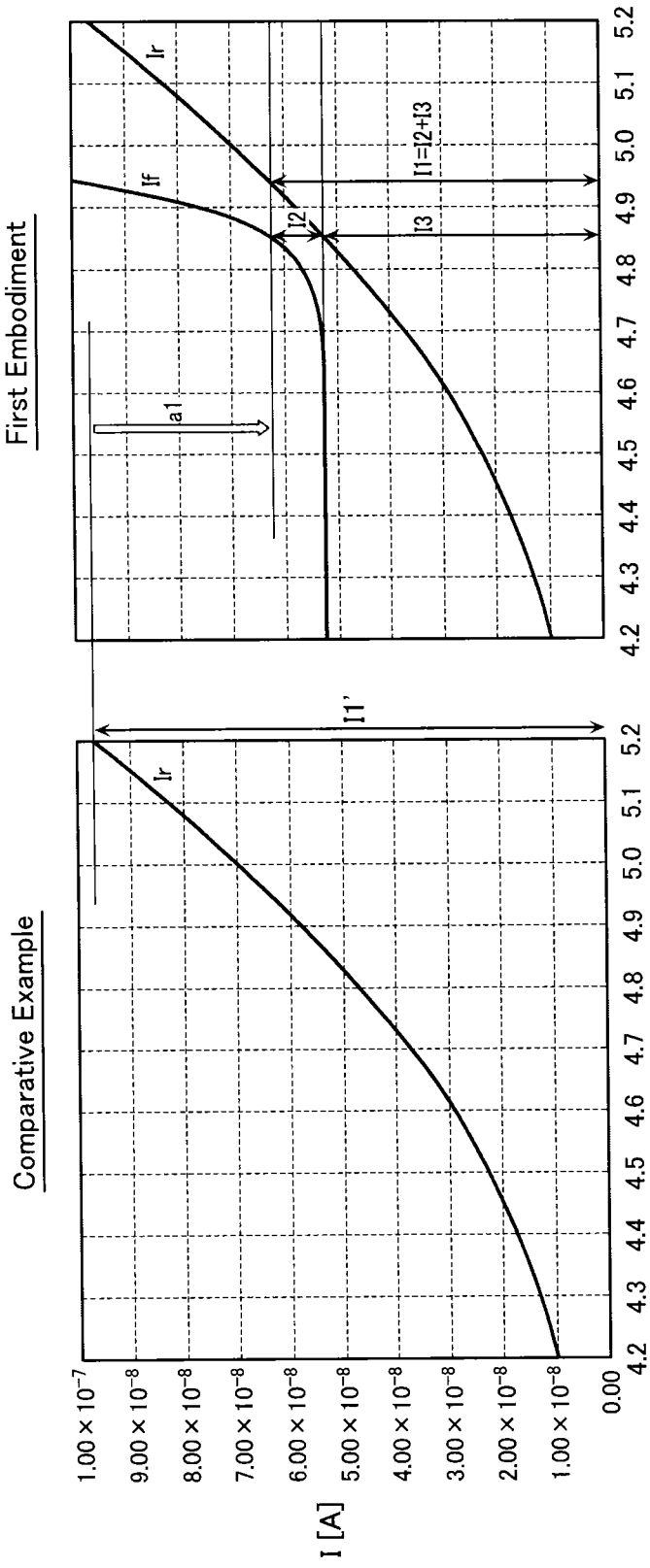
FIG. 6 is a view for explaining a reduction effect of a reverse direction current flowing in an unselected memory cell during forming in the nonvolatile semiconductor memory device according to same embodiment.

FIG. 6 is a graph contrasting the reverse direction current flowing in the memory cells MC3 in the present embodiment and the comparative example. The graph on the left of FIG. 6 shows the voltage-current characteristic of the memory cell diode RDm in the comparative example, and the graph on the right of FIG. 6 shows the voltage-current characteristic of the memory cell diode RDm in the present embodiment.

In the case of the comparative example, the memory cell diode RDm in the unselected memory cells MC3 is applied with a reverse direction bias of 5.2 V, hence a reverse direction current I1' flowing in the unselected memory cells MC3 is approximately $9.64 \times 10^{-8}$ A. In this case, if the memory cell array is 2K×8K, then the total reverse direction current flowing in the unselected memory cells MC3 is $9.64 \times 10^{-8}$ A×(2K×8K−2K−8K+1)=1.62 A, which is of a magnitude great enough to destroy the circuit. Moreover, total power consumption in the unselected memory cells MC3 is as much as 5.2 V×1.62 A=8.41 W.

In contrast, in the case of the present embodiment, the memory cell diode RDm in the unselected memory cells MC3 is only applied with a reverse direction bias of 4.95 V. Hence a reverse direction current I1 flowing in the unselected memory cells MC3 is approximately $5.78 \times 10^{-8}$ A. In this case, if the memory cell array 1 is 2K×8K, then the total reverse direction current flowing in the unselected memory cells MC3 is $5.78 \times 10^{-8}$ A×(2K×8K−2K−8K+1)=0.97 A. Note that this reverse direction current I1 is a sum of a forward direction current I2 flowing in the memory cells MC4 and a reverse direction current I3 flowing in the reverse direction current lowering diode RDr inserted in the unselected bit lines BL. Moreover, total power consumption in the unselected memory cells MC3 is suppressed to 4.95 V×0.97 A=4.80 W.

In other words, the present embodiment enables the reverse direction current flowing in the unselected memory cells MC3 to be reduced by about 40% compared to the comparative example (outlined arrow a1 in FIG. 6), whereby total power consumption in the unselected memory cells MC3 can also be reduced by about 43% compared to the comparative example.

<Structure and Method of Formation of Reverse Direction Current Lowering Diode>

Figure 7:
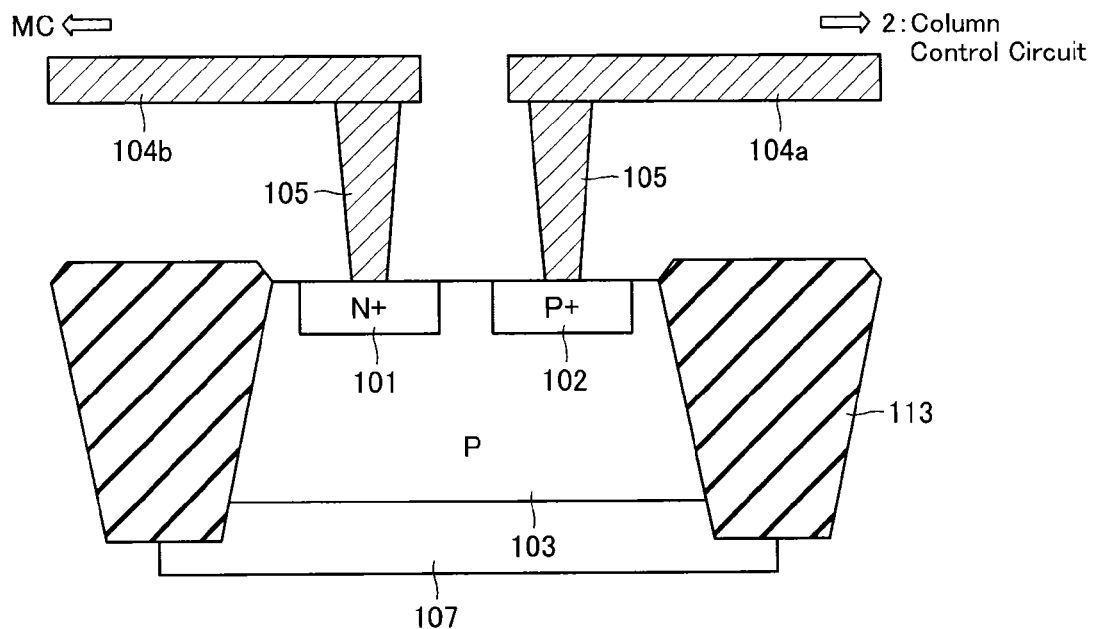
FIG. 7 is an example of a cross-sectional view of the nonvolatile semiconductor memory device according to same embodiment.
Figure 8:
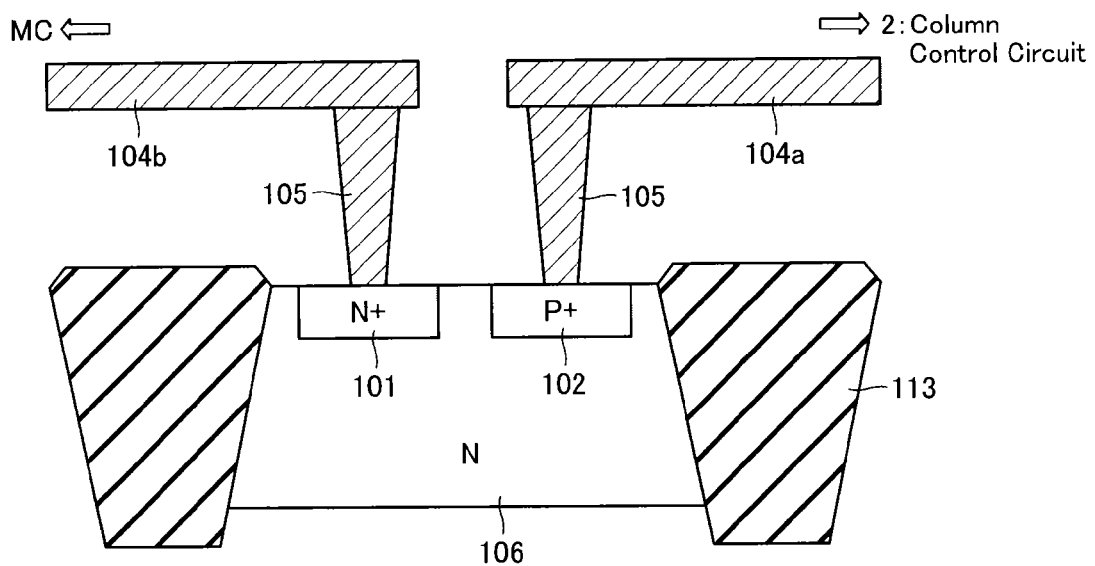
FIG. 8 is another example of a cross-sectional view of the nonvolatile semiconductor memory device according to same embodiment.
Figure 9:
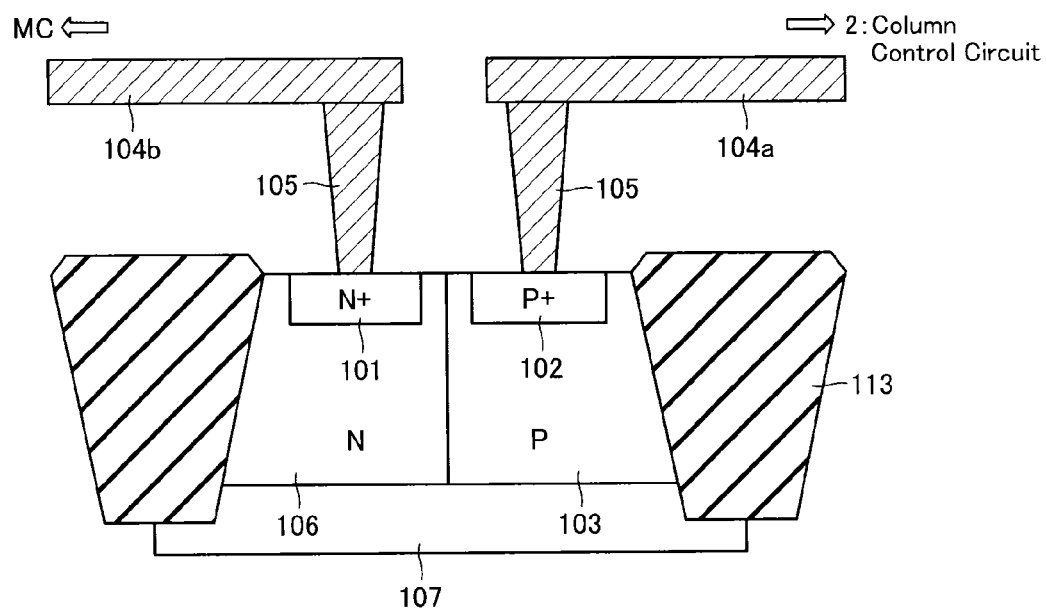
FIG. 9 is another example of a cross-sectional view of the nonvolatile semiconductor memory device according to same embodiment.

Next, examples of a structure and a method of formation of the reverse direction current lowering diode RDr are described using cross-sectional views of the nonvolatile semiconductor memory device shown in FIGS. 7-9.

In the case shown in FIG. 7, the nonvolatile semiconductor memory device comprises a deep N type well 107 stacked on a P type silicon substrate not shown, and a plurality of element isolating trenches 113 extending in a row direction provided on this deep N type well 107. In addition, the nonvolatile semiconductor memory device comprises a P type well 103 formed between two of the element isolating trenches 113 on the deep N type well 107.

Formed in an upper portion of this P type well 103 are an N type high concentration region 101 (first conductivity type impurity region) doped in high concentration with a donor (first conductivity type impurity) and a P type high concentration region 102 (second conductivity type impurity region) doped in high concentration with an acceptor (second conductivity type impurity). Of these, the N type high concentration region 101, by its relationship with the P type well 103, forms a P+/N one-sided abrupt junction configuring the reverse direction current lowering diode RDr.

Additionally, formed on the P type well 103 are metal wiring lines that become the bit lines BL extending from the column control circuit 2 to the memory cells MC. These metal wiring lines are divided into a partial metal wiring line 104a and a partial metal wiring line 104b at a position between the N type high concentration region 101 and the P type high concentration region 102, the partial metal wiring line 104a extending to a side of the column control circuit 2 and the partial metal wiring line 104b extending to a side of the memory cells MC. Moreover, the partial metal wiring lines 104a and 104b are connected, via vias 105 extending in a stacking direction, to the P type high concentration region 102 and the N type high concentration region 101, respectively.

Next, a method of manufacturing of the structure shown in FIG. 7 is described.

First, the deep N type well 107 is formed on the P type silicon substrate not shown, then the plurality of element isolating trenches 113 extending in the row direction are formed.

Then, the acceptor is doped in the deep N type well 107 between the element isolating trenches 113 to form the P type well 103.

Next, the donor is doped in high concentration in the P type well 103 to form the N type high concentration region 101. This causes an N+/P one-sided abrupt junction to be formed from the N type high concentration region 101 and the P type well 103. Note that this process may be performed simultaneously to when a source/drain of a MOSFET in the likes of the column control circuit 2 are formed.

Then, in order to realize a reverse direction current lowering diode RDr of comparatively high reverse withstand voltage, the donor is doped in high concentration in a region sufficiently separated from the N type high concentration region 101 to form the P type high concentration region 102.

Finally, an interlayer insulating film not shown is formed on the N type high concentration region 101, the P type high concentration region 102, the P type well 103, and the element isolating trenches 113. Then, forming the plurality of vias 105 connecting to the N type high concentration region 101 and the P type high concentration region 102 so as to penetrate this interlayer insulating film, and forming the partial metal wiring lines 104a and 104b connecting to these vias 105 allows the structure shown in FIG. 7 to be created.

FIG. 8 is an example where a P+/N one-sided abrupt junction is formed in an N type well 106. In other words, in the case of the nonvolatile semiconductor memory device shown in FIG. 8, the N type well 106 is formed between two of the element isolating trenches 113 on the P type silicon substrate not shown, and the N type high concentration region 101 (first conductivity type impurity region) and the P type high concentration region 102 (second conductivity type impurity region) are formed in an upper portion of this N type well 106. Moreover, a junction between the P type high concentration region 102 and the N type well 106 causes the P+/N one-sided abrupt junction configuring the reverse direction current lowering diode RDr to be formed.

FIG. 9 is an example where fellow wells are joined to form a PN junction. In other words, in the case of the nonvolatile semiconductor memory device shown in FIG. 9, the P type well 103 (second conductivity type well) and the N type well 106 (first conductivity type well) extending in stripes in the row direction are formed on the deep N type well 107 between two of the element isolating trenches 113. Moreover, formed in an upper portion of these P type well 103 and N type well 106 are, respectively, the P type high concentration region 102 (second conductivity type impurity region) doped in higher concentration with the acceptor (second conductivity type impurity) than is the P type well 103 and the N type high concentration region 101 (first conductivity type impurity region) doped in higher concentration with the donor (first conductivity type impurity) than is the N type well 106. Moreover, a junction between the P type well 103 and the N type well 106 causes the PN junction configuring the reverse direction current lowering diode RDr to be formed.

SUMMARY

As described above, the present embodiment, by inserting the reverse direction current lowering diode between the column control circuit and the memory cells enables the reverse direction current flowing in the unselected memory cells connected to the unselected word lines and unselected bit lines and the power consumption in these unselected memory cells to be significantly reduced compared to the comparative example.

Second Embodiment

The structure and method of formation of the reverse direction current lowering diode described in the first embodiment each had the reverse direction current lowering diode provided separately and independently to other elements. In contrast, in the second embodiment, cross-sectional views of the nonvolatile semiconductor memory device shown in FIGS. 10 and 11 are used to describe examples of a structure and method of formation in which an impurity high concentration region that becomes a source or drain of a MOSFET configuring peripheral circuits such as the column control circuit and an impurity high concentration region that becomes an anode or cathode of the reverse direction current lowering diode are commonly formed.

Figure 10:
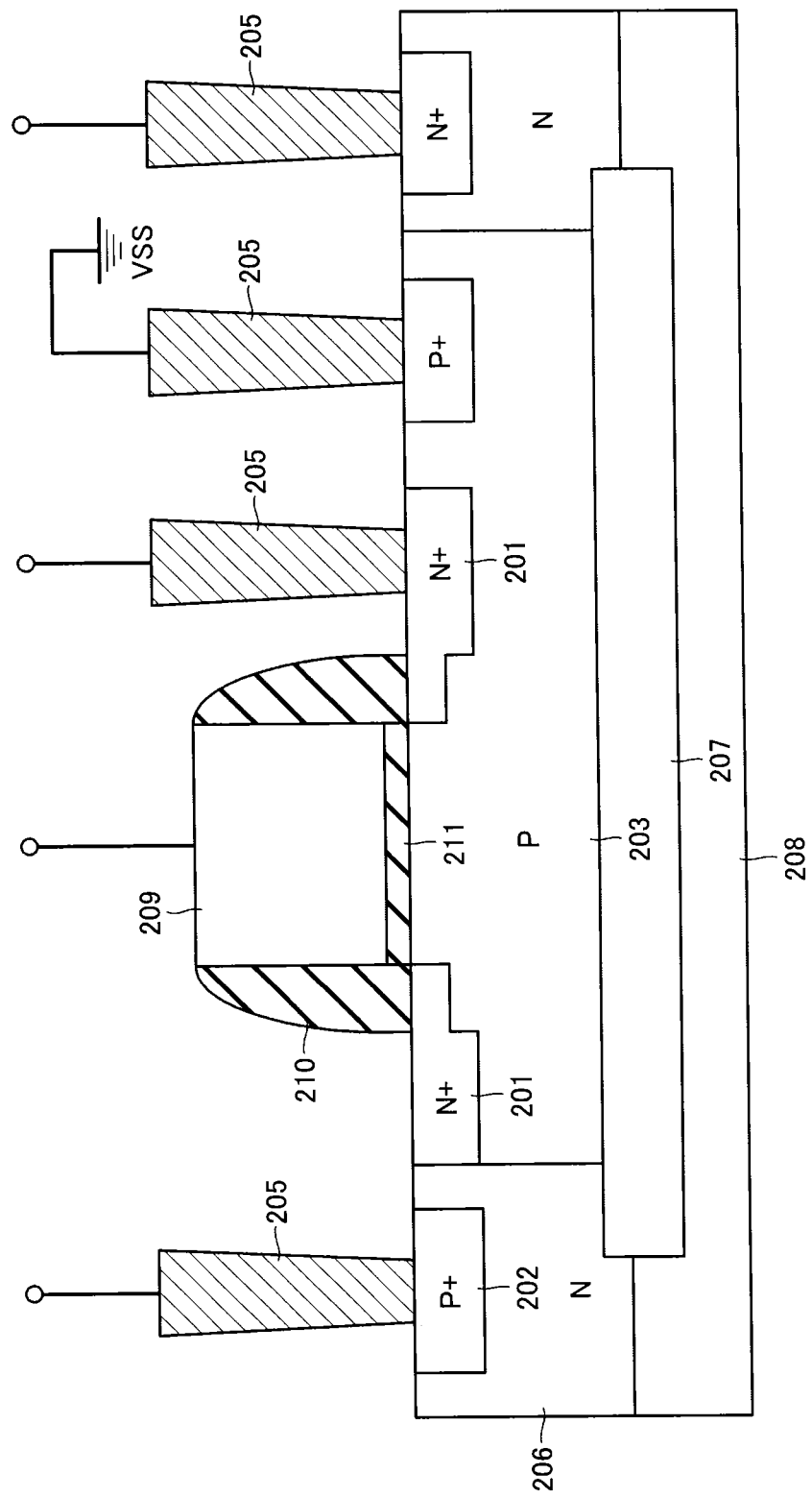
FIG. 10 is an example of a cross-sectional view of a nonvolatile semiconductor memory device according to a second embodiment.
Figure 11:
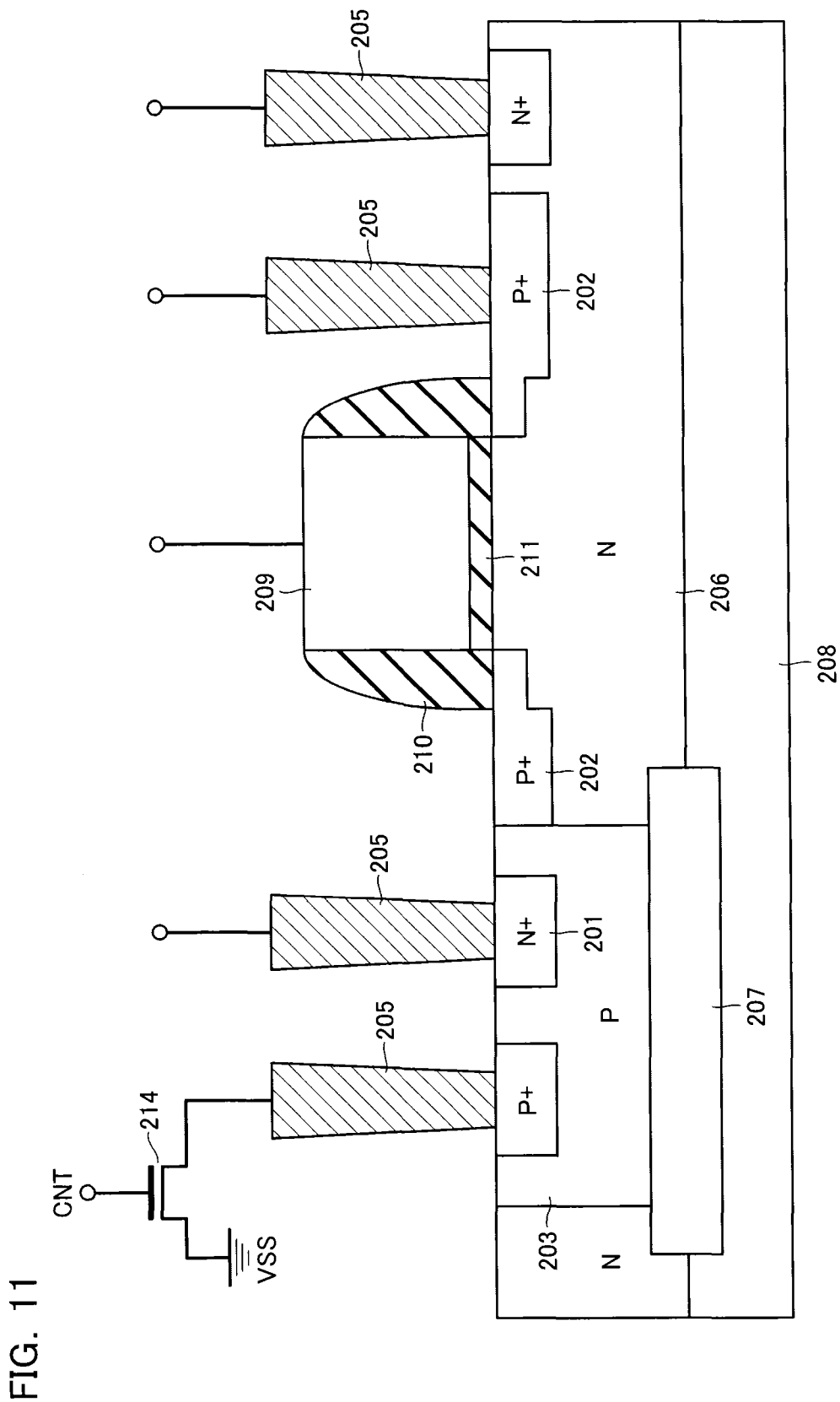
FIG. 11 is another example of a cross-sectional view of the nonvolatile semiconductor memory device according to same embodiment.

In the case shown in FIG. 10, the nonvolatile semiconductor memory device comprises a P type silicon substrate 208, a deep N type well 207 formed in a portion above this P type silicon substrate 208, a P type well 203 formed on this deep N type well 207, and N type wells 206 formed joining to both sides of this P type well 203.

Of these, formed in an upper portion of the P type well 203 are two N type high concentration regions 201 (first conductivity type impurity regions) doped in high concentration with a donor (first conductivity type impurity). These two N type high concentration regions 201 configure a source and drain of an N type MOSFET, and formed on the P type well 203 between these two N type high concentration regions 201 via a gate oxide film and sandwiched between spacers 210 is polysilicon 209 that becomes a gate of the N type MOSFET. In addition, formed in an upper portion of the N type well 206 is a P type high concentration region 202 (second conductivity type impurity region) doped in high concentration with an acceptor (second conductivity type impurity). Moreover, this P type high concentration region 202, by its relationship with the N type well 202, forms a P+/N one-sided abrupt junction configuring the reverse direction current lowering diode. Note that if the N type high concentration region 201 and the P type high concentration region 202 are disposed sufficiently separated, reverse withstand voltage of the reverse direction current lowering diode RDr can be raised.

Next, a method of manufacturing the structure shown in FIG. 10 is described.

First, the acceptor is doped in the P type silicon substrate 208 after formation of the deep N type well 107 to form the P type well 203, and the donor is doped in a region contacting this P type well 203 to form the N type well 206.

Then, after forming the gate oxide film 211 and the polysilicon 209 on the P type well 203, the gate of the N type MOSFET is processed.

Next, the donor is doped in high concentration in regions on both sides of the gate in the P type well 203 to form the two N type high concentration regions 201.

Then, P type ions are implanted in the N type well 202 adjacent to the P type well 203 to form the P type high concentration region 202. This causes a P+/N one-sided abrupt junction to be formed from the P type high concentration region 202 and the N type well 206.

Finally, forming vias 205 connected to the N type high concentration region 201, the P type high concentration region 202, and so on, and required metal wiring lines connected to these vias 206 allows the structure shown in FIG. 10 to be created.

FIG. 11 is an example in which a P type high concentration region that becomes a source and drain of a P type MOSFET and a P type high concentration region that becomes an anode of the reverse direction current lowering diode are commonly formed. In other words, in the case of the nonvolatile semiconductor memory device shown in FIG. 11, formed in an upper portion of the N type well 208 are two P type high concentration regions 202 (first conductivity type impurity regions) doped in high concentration with an acceptor (first conductivity type impurity). These two P type high concentration regions 202 become, respectively, a source and drain of the P type MOSFET. In addition, formed in an upper portion of the P type well 203 is an N type high concentration region 201 (second conductivity type impurity region) doped in high concentration with a donor (second conductivity type impurity). This N type high concentration region 201 becomes a cathode of the reverse direction current lowering diode RDr. Moreover, a junction between the N type high concentration region 201 and the P type well 203 causes an N+/P one-sided abrupt junction configuring the reverse direction current lowering diode to be formed.

Note that in the case of the nonvolatile semiconductor memory device shown in FIG. 11, when the P type MOSFET is in an off state, the P type well 203 on a drain side of the P type MOSFET must be driven to the ground voltage VSS. Therefore, in this nonvolatile semiconductor memory device, a transistor 214 is provided for connecting the P type well 203 and the ground voltage VSS. Moreover, this transistor 214 is controlled by a control signal CNT to be in an off state when the P type MOSFET is in an on state and to be in an on state when the P type MOSFET is in an off state.

The present embodiment not only displays similar advantages to those of the first embodiment, but also has an impurity high concentration region that becomes a source or drain of a MOSFET in peripheral circuits and an impurity high concentration region that becomes an anode or cathode of the diode commonly configured, and hence allows a nonvolatile semiconductor memory device having a small chip area compared to that of the first embodiment to be provided.

Third Embodiment

Figure 12:
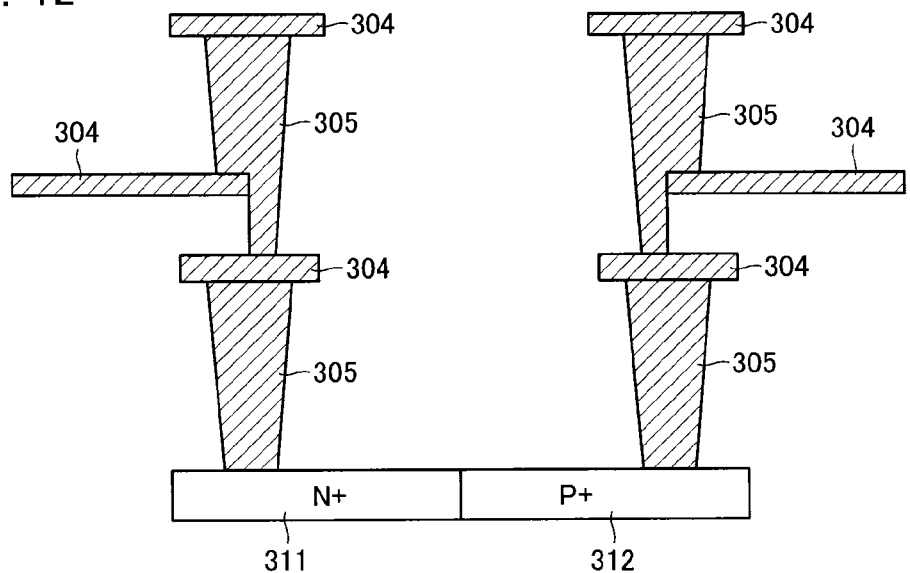
FIG. 12 is an example of a cross-sectional view of a nonvolatile semiconductor memory device according to a third embodiment.

In a third embodiment, a cross-sectional view of the nonvolatile semiconductor memory device shown in FIG. 12 is used to describe an example of a structure and method of formation in the case of adopting a transverse type polysilicon diode for the reverse direction current lowering diode.

In the case shown in FIG. 12, the nonvolatile semiconductor memory device comprises a polysilicon thin film formed on a P type silicon substrate not shown. This polysilicon thin film is configured from an N type polysilicon thin film 311 (first conductivity type impurity region) having polysilicon doped in high concentration with a donor (first conductivity type impurity) and a P type polysilicon thin film 312 (second conductivity type impurity region) having polysilicon doped in high concentration with an acceptor (second conductivity type impurity). These N type polysilicon thin film 311 and P type polysilicon thin film 312 are joined thereby configuring a PN junction that becomes the reverse direction current lowering diode. In addition, connected on the N type polysilicon thin film 311 and P type polysilicon thin film 312, via vias 305, are required metal wiring lines 304 such as bit lines BL, and so on.

Next, a structure shown in FIG. 12 and method of manufacturing are described.

First, a polysilicon thin film is formed on the P type silicon substrate not shown. At this time, the polysilicon thin film preferably undergoes film formation with a thickness allowing uniform impurity concentration to be maintained. However, in order to obtain an equivalent performance to the memory cell diode RDm regarding forward direction current, it is required to set the thickness of the polysilicon thin film such that cross-sectional area of the later-formed reverse direction current lowering diode RDr and memory cell diode RDm are comparable. Similarly, a length of the reverse direction current lowering diode RDr is formed taking a large enough length (for example, 80 nm or more) to secure a sufficient reverse withstand voltage.

Then, part of the polysilicon thin film is doped in high concentration with the donor to form the N type polysilicon thin film 311, and a region adjacent to this N type polysilicon thin film 311 is doped in high concentration with the acceptor to form the P type polysilicon thin film 312. Note that when forming the N type polysilicon thin film 311, the donor is doped after first covering a region that becomes the P type polysilicon thin film 312 by lithography. Similarly, when forming the P type polysilicon thin film 312, the acceptor is doped after first covering a region that becomes the N type polysilicon thin film 311 by lithography. In addition, the PN junction configured by the N type polysilicon thin film 311 and the P type polysilicon thin film 312 is formed such that a direction from the P type polysilicon thin film 312 toward the N type polysilicon thin film 311 is a direction that reverse direction bias applied to the unselected memory cells MC3 is relaxed. The polysilicon diode that becomes the reverse direction current lowering diode RDr is formed in accordance with the above.

Finally, an interlayer insulating film not shown is formed on the polysilicon thin film. Then, forming a plurality of vias 305 connected to the N type polysilicon thin film 311 and the P type polysilicon thin film 312 so as to penetrate this interlayer insulating film, and forming metal wiring lines 304 connected to these vias 305 allows the structure shown in FIG. 12 to be created.

The present embodiment allows similar advantages to those of the first and second embodiments to be obtained, even when a polysilicon diode is employed as the reverse direction current lowering diode.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, all cases of the aforementioned embodiments are described assuming the word line to be the first line and the bit line to be the second line. However, it is also possible to configure the bit line to be the first line and the word line to be the second line. In addition, the first conductivity type impurity and the second conductivity type impurity may be interchanged with one another.

Furthermore, in the aforementioned embodiments, mainly forming is described. However, provided the nonvolatile semiconductor memory device has a reverse direction current flowing in unselected memory cells during the setting operation or resetting operation, the aforementioned embodiments may all be applied also to the setting operation or resetting operation.

What is claimed is:

1. A nonvolatile semiconductor memory device, comprising:
   a memory cell array including a plurality of first lines and second lines intersecting each other and a plurality of memory cells provided at each of intersections of the plurality of first lines and second lines and each having a variable resistance element and a first diode connected in series;
   a first line control circuit for supplying a selected first line voltage to a selected first line among the first lines that is connected to a selected access target memory cell among the memory cells, and supplying an unselected first line voltage to an unselected first line among the first lines other than the selected first line; and
   a second line control circuit for supplying a selected second line voltage to a selected second line among the second lines that is connected to the selected access target memory cell, and supplying an unselected second line voltage to an unselected second line among the second lines other than the selected second line,
   the memory cells each having one of the second lines connected to an anode side of the first diode and one of the first lines connected to a cathode side of the first diode, and
   the memory cell array including a second diode which is inserted in each of the second lines between the second line control circuit and the memory cells and has a side of the second line control circuit as an anode and a side of the memory cells as a cathode.

2. The nonvolatile semiconductor memory device according to claim 1, wherein
   the unselected first line voltage is higher than the selected first line voltage and lower than the selected second line voltage, and
   the unselected second line voltage is lower than the selected first line voltage.

3. The nonvolatile semiconductor memory device according to claim 1, wherein
   the memory cell array is formed on a well formed in a substrate, and
   the second diode is configured from a first conductivity type impurity region formed in the well and doped with a first conductivity type impurity, and a second conductivity type impurity region formed in the well and doped with a second conductivity type impurity different from the first conductivity type impurity.

4. The nonvolatile semiconductor memory device according to claim 3, wherein
the second line control circuit includes a field effect transistor formed such that either one of a source and a drain is common with the first conductivity type impurity region of the second diode.

5. The nonvolatile semiconductor memory device according to claim 1, wherein
the second diode is a polysilicon diode.

6. The nonvolatile semiconductor memory device according to claim 3, wherein
the well is a first conductivity type well in which a lower concentration of the first conductivity type impurity is included than in the first conductivity type impurity region, or a second conductivity type well in which a lower concentration of the second conductivity type impurity is included than in the second conductivity type impurity region.

7. The nonvolatile semiconductor memory device according to claim 3, wherein
the well is configured connecting a first conductivity type well in an upper portion of which the first conductivity type impurity region is formed and in which a lower concentration of the first conductivity type impurity is included than in the first conductivity type impurity region, and a second conductivity type well in an upper portion of which the second conductivity type impurity region is formed and in which a lower concentration of the second conductivity type impurity is included than in the second conductivity type impurity region.

8. A nonvolatile semiconductor memory device, comprising:
a memory cell array including a plurality of first lines and second lines intersecting each other and a plurality of memory cells provided at each of intersections of the plurality of first lines and second lines and each having a variable resistance element and a first diode connected in series;
a first line control circuit for supplying a selected first line voltage to a selected first line among the first lines that is connected to a selected access target memory cell among the memory cells, and supplying an unselected first line voltage to an unselected first line among the first lines other than the selected first line; and
a second line control circuit for supplying a selected second line voltage to a selected second line among the second lines that is connected to the selected access target memory cell, and supplying an unselected second line voltage which is lower than the unselected first line voltage to an unselected second line among the second lines other than the selected second line,
the memory cells each having one of the second lines connected to an anode side of the first diode and one of the first lines connected to a cathode side of the first diode, and
the memory cell array including a second diode which is inserted in each of the second lines between the second line control circuit and the memory cells and has a side of the second line control circuit as an anode and a side of the memory cells as a cathode.

9. The nonvolatile semiconductor memory device according to claim 8, wherein
the unselected first line voltage is higher than the selected first line voltage and lower than the selected second line voltage, and
the unselected second line voltage is lower than the selected first line voltage.

10. The nonvolatile semiconductor memory device according to claim 8, wherein
the memory cell array is formed on a well formed in a substrate, and
the second diode is configured from a first conductivity type impurity region formed in the well and doped with a first conductivity type impurity, and a second conductivity type impurity region formed in the well and doped with a second conductivity type impurity different from the first conductivity type impurity.

11. The nonvolatile semiconductor memory device according to claim 10, wherein
the second line control circuit includes a field effect transistor formed such that either one of a source and a drain is common with the first conductivity type impurity region of the second diode.

12. The nonvolatile semiconductor memory device according to claim 8, wherein
the second diode is a polysilicon diode.

13. The nonvolatile semiconductor memory device according to claim 10, wherein
the well is a first conductivity type well in which a lower concentration of the first conductivity type impurity is included than in the first conductivity type impurity region, or a second conductivity type well in which a lower concentration of the second conductivity type impurity is included than in the second conductivity type impurity region.

14. The nonvolatile semiconductor memory device according to claim 10, wherein
the well is configured connecting a first conductivity type well in an upper portion of which the first conductivity type impurity region is formed and in which a lower concentration of the first conductivity type impurity is included than in the first conductivity type impurity region, and a second conductivity type well in an upper portion of which the second conductivity type impurity region is formed and in which a lower concentration of the second conductivity type impurity is included than in the second conductivity type impurity region.

15. A nonvolatile semiconductor memory device, comprising:
a memory cell array including a plurality of first lines and second lines intersecting each other and a plurality of memory cells provided at each of intersections of the plurality of first lines and second lines and each having a variable resistance element and a first diode connected in series;
a first line control circuit for supplying a selected first line voltage to a selected first line among the first lines that is connected to a selected access target memory cell among the memory cells, and supplying an unselected first line voltage to an unselected first line among the first lines other than the selected first line; and
a second line control circuit for supplying a selected second line voltage to a selected second line among the second lines that is connected to the selected access target memory cell, and supplying an unselected second line voltage which is lower than the unselected first line voltage to an unselected second line among the second lines other than the selected second line,
the memory cell array including a second diode which is inserted in each of the second lines between the second line control circuit and the memory cells and has a side of the second line control circuit as an anode and a side of the memory cells as a cathode.

16. The nonvolatile semiconductor memory device according to claim 15, wherein
the unselected first line voltage is higher than the selected first line voltage and lower than the selected second line voltage, and
the unselected second line voltage is lower than the selected first line voltage.

17. The nonvolatile semiconductor memory device according to claim 15, wherein
the memory cell array is formed on a well formed in a substrate, and
the second diode is configured from a first conductivity type impurity region formed in the well and doped with a first conductivity type impurity, and a second conductivity type impurity region formed in the well and doped with a second conductivity type impurity different from the first conductivity type impurity.

18. The nonvolatile semiconductor memory device according to claim 17, wherein
the second line control circuit includes a field effect transistor formed such that either one of a source and a drain is common with the first conductivity type impurity region of the second diode.

19. The nonvolatile semiconductor memory device according to claim 15, wherein
the second diode is a polysilicon diode.

20. The nonvolatile semiconductor memory device according to claim 17, wherein
the well is a first conductivity type well in which a lower concentration of the first conductivity type impurity is included than in the first conductivity type impurity region, or a second conductivity type well in which a lower concentration of the second conductivity type impurity is included than in the second conductivity type impurity region.

* * * * *